United States Patent
Jeong et al.

(10) Patent No.: US 10,937,953 B2
(45) Date of Patent: Mar. 2, 2021

(54) TUNABLE TETRAGONAL FERRIMAGNETIC HEUSLER COMPOUND WITH PMA AND HIGH TMR

(71) Applicants: Samsung Electronics Co., LTD., Gyeonggi-do (KR); INTERNATIONAL BUSINESS MACHINES CORPORATION, Armonk, NY (US)

(72) Inventors: Jaewoo Jeong, Los Altos, CA (US); Mahesh G. Samant, San Jose, CA (US); Stuart S. P. Parkin, San Jose, CA (US); Yari Ferrante, San Jose, CA (US)

(73) Assignees: Samsung Electronics Co., Ltd., Gyeonggi-do (KR); INTERNATIONAL BUSINESS MACHINES CORPORATION, Armonk, NY (US)

( * ) Notice: Subject to any disclaimer, the term of this patent is extended or adjusted under 35 U.S.C. 154(b) by 32 days.

(21) Appl. No.: 16/260,024

(22) Filed: Jan. 28, 2019

(65) Prior Publication Data

US 2020/0243755 A1 Jul. 30, 2020

(51) Int. Cl.
*H01L 43/10* (2006.01)
*H01F 10/32* (2006.01)
(Continued)

(52) U.S. Cl.
CPC ............ *H01L 43/10* (2013.01); *G11C 11/161* (2013.01); *H01F 10/3286* (2013.01);
(Continued)

(58) Field of Classification Search
CPC ............ H01L 43/10; G11C 2211/5615; G11C 11/161
(Continued)

(56) References Cited

U.S. PATENT DOCUMENTS 6,834,005 B1 12/2004 Parkin
8,008,097 B2 8/2011 Parkin
(Continued)

OTHER PUBLICATIONS

Bedau et al., Spin-Transfer Pulse Switching: From the Dynamic to the Thermally Activated Regime, Applied Physics Letters, 97, 262502, 2010.
(Continued)

*Primary Examiner* — David Vu
*Assistant Examiner* — Brandon C Fox
(74) *Attorney, Agent, or Firm* — Van Pelt, Yi & James LLP

(57) ABSTRACT

A device is disclosed. The device includes a tetragonal Heusler compound of the form $Mn_{3-x}Co_xGe$, wherein $0<x\leq 1$, wherein Co accounts for at least 0.4 atomic percent of the Heusler compound. The device also includes a substrate oriented in the direction (001) and of the form $YMn_{1+d}$, wherein Y includes an element selected from the group consisting of Ir and Pt, and $0\leq d\leq 4$. The tetragonal Heusler compound and the substrate are in proximity with each other, thereby allowing spin-polarized current to pass from one through the other. In one aspect, the device also includes a multi-layered structure that is non-magnetic at room temperature. The structure includes alternating layers of Co and E. E includes at least one other element that includes Al. The composition of the structure is represented by $Co_{1-y}E_y$, with y being in the range from 0.45 to 0.55.

27 Claims, 13 Drawing Sheets

(51) Int. Cl.
   *H01L 27/22* (2006.01)
   *H01L 43/02* (2006.01)
   *G11C 11/16* (2006.01)

(52) U.S. Cl.
   CPC ...... *H01L 43/02* (2013.01); *G11C 2211/5615* (2013.01); *H01L 27/222* (2013.01)

(58) Field of Classification Search
   USPC .......................................................... 257/421
   See application file for complete search history.

(56) References Cited

U.S. PATENT DOCUMENTS

| | | | | |
|---|---|---|---|---|
| 2015/0162378 | A1* | 6/2015 | Carey | ..................... H01L 43/08 257/421 |
| 2016/0217842 | A1* | 7/2016 | Jeong | .................. H01F 10/1936 |
| 2017/0140784 | A1* | 5/2017 | Sukegawa | ............. G11C 11/161 |
| 2018/0351090 | A1* | 12/2018 | Suzuki | .................... H01L 43/08 |
| 2018/0366639 | A1* | 12/2018 | Kato | ..................... G11C 11/161 |
| 2020/0044144 | A1* | 2/2020 | Sukegawa | ............... H01L 43/02 |
| 2020/0098410 | A1* | 3/2020 | Gosavi | ................. H01L 43/12 |
| 2020/0105999 | A1* | 4/2020 | Jeong | ..................... G11C 11/16 |

OTHER PUBLICATIONS

Graf et al., Simple Rules for the Understanding of Heusler Compounds, Progress in Solid State Chemistry, 39, 2011.

Jeong et al., Termination Layer Compensated Tunnelling Magnetoresistance in Ferrimagnetic Heusler Compounds with High Perpendicular Magnetic Anisotropy, Nature Communications, published Jan. 18, 2016.

Wortmann et al., Ab Initio Calculations of Interface Effects in Tunnelling Through MgO Barriers on Fe(100), Institute of Physics Publishing, Journal of Physics: Condensed Matter, Matter 16, published Nov. 19, 2004.

* cited by examiner

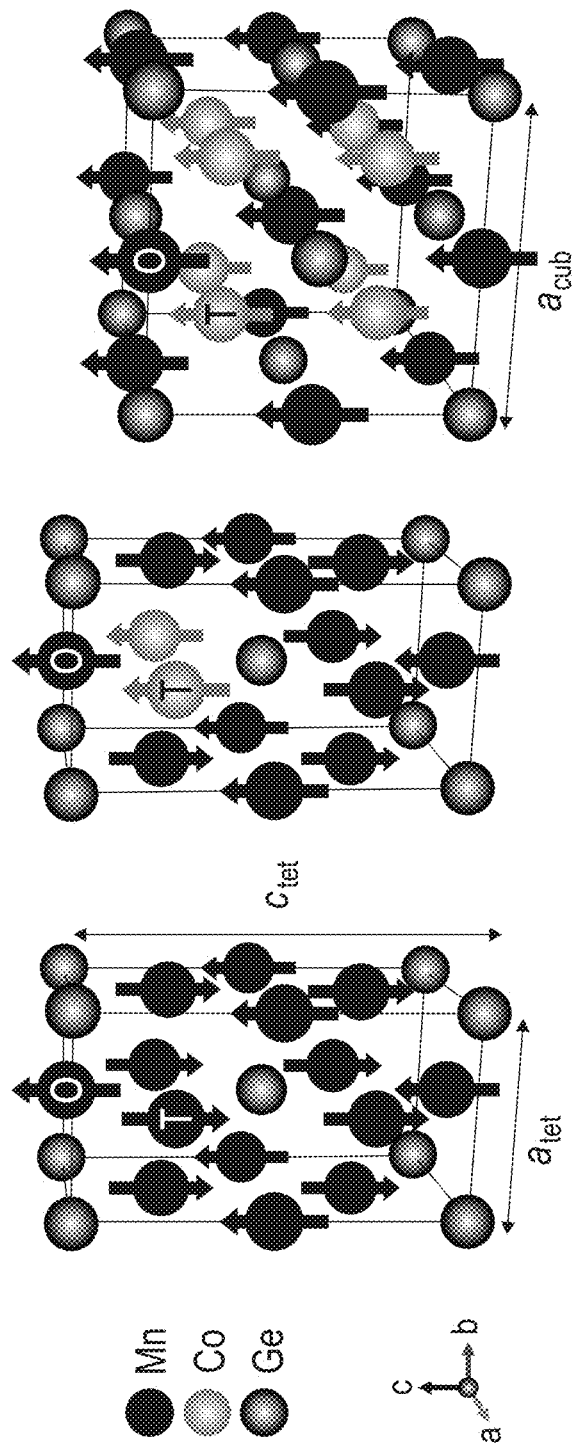

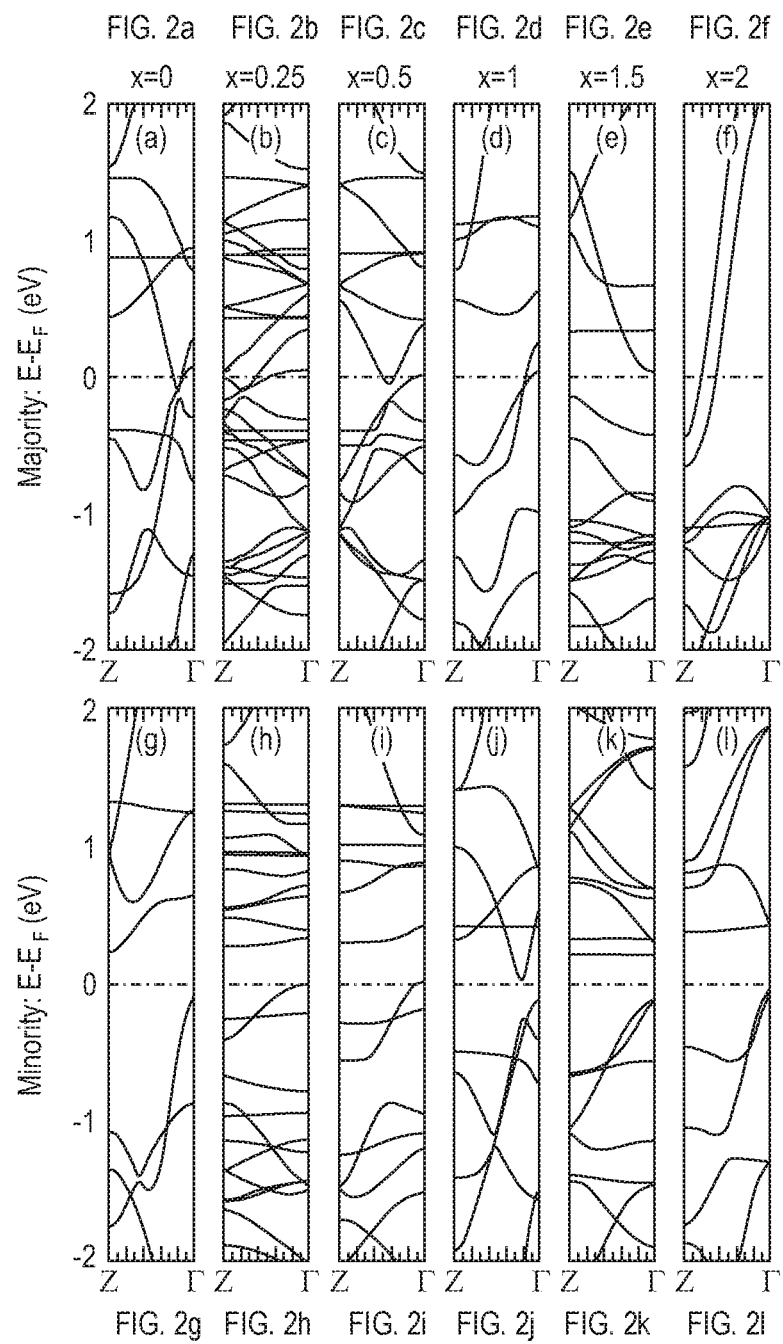

TUNABLE TETRAGONAL FERRIMAGNETIC HEUSLER COMPOUND WITH PMA AND HIGH TMR

BACKGROUND OF THE INVENTION

In today's magnetic random access memory (MRAM) the basic storage element is a magnetic tunnel junction (MTJ) which is composed of two magnetic layers separated by an ultra-thin insulating layer referred to as a "tunnel barrier". The resistance of the MTJ depends on the relative orientation of the magnetization of the two magnetic layers. The magnetization of the so-called storage or memory layer is toggled between being parallel or anti-parallel to the magnetization of the reference magnetic layer. Currently, the change in magnetic state of the MTJ is achieved by passing an electric current through the device. In today's MRAM, the magnetic electrodes of the MTJ are formed from ferromagnetic alloys of Co, Fe, and B with their magnetic moment aligned perpendicular to the layer. This perpendicular alignment of magnetization of a CoFeB alloy arises from interfacial effects which are typically weak limiting the MRAM devices to sizes >=20 nm. It is essential to find alternate magnetic material for use within MTJs which has perpendicular magnetic anisotropy (PMA) due to its bulk properties.

BRIEF DESCRIPTION OF THE DRAWINGS

Various embodiments of the invention are disclosed in the following detailed description and the accompanying drawings.

FIGS. 1A-1C depict crystal structures schematics.

FIGS. 2a-l depict electronic bands structures of ordered $Mn_{3-x}Co_xGe$ compounds.

DETAILED DESCRIPTION

Figure 3A:
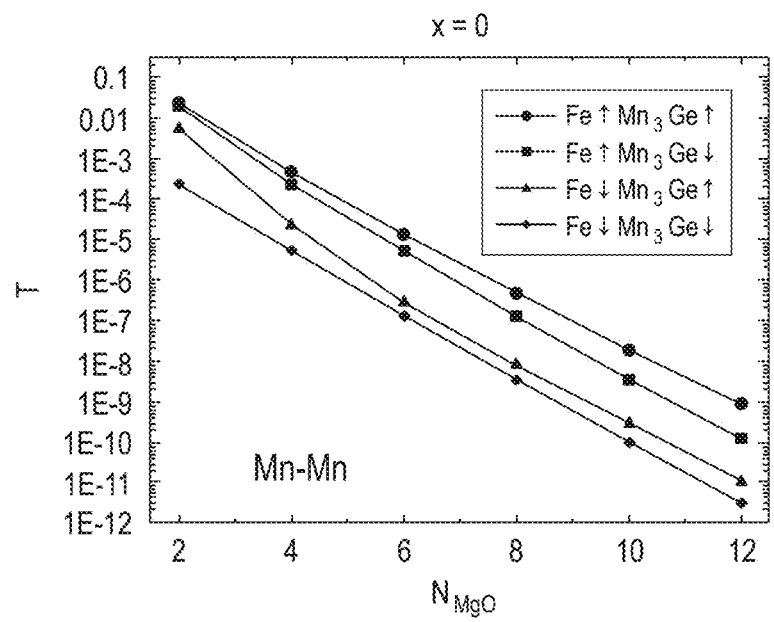
FIGS. 3A-3F depict transmission and tunneling magnetoresistance for exemplary embodiments $Mn_3Ge/MgO/Fe$ and $Mn_{2.75}Co_{0.25}Ge/MgO/Fe$ MTJs.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

In some embodiments, a device includes a tetragonal Heusler and a substrate. The tetragonal Heusler of the form $Mn_{3-x}Co_xGe$, wherein $0<x\leq 1$, wherein Co accounts for at least 0.4 atomic percent of the Heusler compound. The substrate is oriented in the direction (001) and of the form $YMn_{1+d}$, wherein Y includes an element selected from the group consisting of Ir and Pt, and $0\leq d\leq 4$. The tetragonal Heusler and the substrate are in proximity with each other, thereby allowing spin-polarized current to pass from one through the other. In one aspect, Y is Ir. In one embodiment, a tunnel barrier is in contact with the tetragonal Heusler. The tunnel barrier may include Mg and O. In some embodiments, the device further includes a TaN layer between and in contact with the tetragonal Heusler and the substrate. In some embodiments, the tetragonal Heusler is of the form $Mn_{3-x}Co_xGe$, wherein $0<x\leq 1$, and the substrate is of the form $IrMn_3$. In some embodiments, a magnetization of the Heusler compound is substantially perpendicular to the film plane. The thickness of the Heusler compound may be at least 10 Angstroms and not more than 500 angstroms. In some embodiments, a TaN layer is underneath the substrate and in contact with the substrate. The device may be used in a memory element in some embodiments.

In some embodiments, a device includes a tetragonal Heusler, a multi-layered structure and a substrate. The tetragonal Heusler is of the form $Mn_{3-x}Co_xGe$, wherein $0<x\leq 1$, wherein Co accounts for at least 0.4 atomic percent of the Heusler compound. The multi-layered structure is non-magnetic at room temperature. The multi-layered structure includes alternating layers of Co and E, wherein E comprises at least one other element that includes Al and wherein the composition of the multi-layered structure is represented by $Co_{1-y}E_y$, with y being in the range from 0.45 to 0.55. The tetragonal Heusler and the substrate are in proximity with each other, thereby allowing spin-polarized current to pass from one through the other. In some embodiments the device includes a tunnel barrier overlying the tetragonal Heusler layer, thereby permitting current to pass through both the tunnel barrier and the tetragonal Heusler layer. The tunnel barrier may include Mg and O. In some embodiments, E is an AlGe alloy. In some embodiments, the device may be used as a memory element.

In some embodiments, a device includes a substrate, an underlayer, a first magnetic layer, a tunnel barrier and a second magnetic layer. The underlayer is oriented in the direction (001) and is non-magnetic at room temperature. The first magnetic layer includes a Heusler compound $Mn_{3-x}Co_xGe$, wherein $0<x\leq 1$. The first magnetic layer is in contact with the underlayer and the magnetic moment of the first layer is switchable. The tunnel barrier overlies the first magnetic layer. The second magnetic layer is in contact with the tunnel barrier. In some embodiments, the device includes a capping layer in contact with the second magnetic layer. In some embodiments, the magnetic moment of the first magnetic layers is substantially perpendicular to the interface between the structure and the first magnetic layer.

The structural and magnetic properties of several $Mn_{3-x}Co_xGe$ Heusler compounds were investigated theoretically and experimentally. The structure evolves from a tetragonal to a cubic phase with increasing Co content as well as a transition from a ferri-magnetic phase to a ferro-magnetic phase but at a higher Co content. Therefore, intermediate compositions, which have low magnetization and PMA, may be of interest for STT-MRAM applications. Our theoretical studies show that the Brillouin zone filtering effect, which was responsible for the compensated tunneling magnetoresistance at the $Mn_3Ge/MgO$ interface of perpendicularly-magnetized MTJs, is suppressed in compounds with Co concentrations in the range $x_c < x \le 1$ with $x_c \sim 0.2$. Therefore, the compensation between the SP and BZF effects can be eliminated, leading to a significant increase of the TMR in a $Mn_{3-x}Co_xGe/MgO/Fe$ MTJ with x=0.25 (TMR 500%), as compared to that with x=0 (TMR<100%), for the same range of MgO thicknesses ($N_{MgO}$=8-12).

Computational Study

A. Crystal and magnetic structure of ordered $Mn_{3-x}Co_xGe$ compounds with x=0, 0.25, 0.5, 1, 1.5, and 2

FIGS. 1A-1C depict crystal structure schematics of tetragonal-$Mn_3Ge$ (FIG. 1A), tetragonal-$Mn_{2.5}Co_{0.5}Ge$ (FIG. 1B) and cubic-$MnCo_2Ge$ (FIG. 1C). $a_{tet}$, $c_{tet}$ and $a_{cub}$ represent the tetragonal and cubic lattice constants, respectively. The labels "T" and "O" indicate the sites that are tetrahedrally and octahedrally coordinated, respectively, by Ge atoms. The tetragonal unit cell can be derived from the cubic cell by means of a 45° in-plane rotation ($a_{cub} = \sqrt{2} \cdot a_{tet}$), and an elongation along the c axis. Note that the direction of the Mn and Co moments are chosen such that the unit cell's magnetic moment is positive along the c axis in (a) and (b), and along the +c axis in (c). The atom sizes are not to scale.

To find the ground state structure of various $Mn_{3-x}Co_xGe$ compounds, whether cubic or tetragonal, and whether regular or inverse, and the corresponding lattice constants and magnetic configuration, we carried out calculations using the generalized gradient approximation within density functional theory implemented within the VASP program with projector augmented wave potentials. The lowest energy configurations for x=0, 0.25, 0.5, 1, 1.5, 2 were found from total energy calculations for various atomic orderings of the Mn and Co atoms within the unit cell. The unit cell was varied in size according to x: for x=0, 1 and 2 the unit cell has 4 atoms; for x=0.5 and 1.5 the unit cell has 8 atoms; and for x=0.25 the unit cell has 16 atoms [in subsection A we consider only ordered compounds, while disordered compounds are considered in subsection D by using the virtual crystal approximation]. To find the ground state magnetic configuration the energy was calculated for many different initial magnetic configurations. For compounds with 4 atoms in the unit cell, a 6×6×6 k-point mesh was used for an initial rough estimate of the lattice parameters, and a 10×10× 10 k-point mesh with the energy cut-off equal to 400 eV was used for fine-tuning the lattice parameters. For compounds with 8 and 16 atoms per unit cell, the number of k-divisions was reduced along the elongated axes.

Table I summarizes the ground state structure and the corresponding magnetic state for both cubic and tetragonal structures. In some cases no metastable tetragonal state was found. The minimum energy configuration was found to be tetragonal for $Mn_3Ge$, tetragonal-inverse for $Mn_2CoGe$, and cubic-regular for $MnCo_2Ge$. The minimum energy configuration for 8 and 16 atoms in the unit cell was found to be a stack of several 4 atom unit cells along the z axis. Thus, for x=0.5, the ground state is composed of a tetragonal-inverse $Mn_2CoGe$ unit cell placed above a tetragonal $Mn_3Ge$ unit cell. For x=0.25, the ground state consists of a tetragonal-inverse $Mn_2CoGe$ unit cell placed above three tetragonal $Mn_3Ge$ unit cells aligned along the z-direction. Finally, for x=1.5, the ground state is composed of the cubic-inverse $Mn_2CoGe$ unit cell placed above the cubic-regular $MnCo_2Ge$ unit cell. The calculations showed that the ground state remains tetragonal for x varying up to and including 1. For x>1 the ground state becomes cubic.

TABLE I

Structure type, lattice constants, stability energy, total magnetic moment per formula unit (considering 4 atoms), and magnetic moment, m, of individual Mn and Co atoms. Individual m values refer to atoms of Co if highlighted in bold characters, and Mn if otherwise. Magnetic moments $m_{(O)}$ and $m_{(T)}$ specify individual atoms located at octahedrally coordinated (layer with the main group Ge atoms) and tetrahedrally coordinated sites in indicated 4-atom cells.

| x | Alloy | Reg/Inv | $a_{tet}$ [Å] | $c_{tet}$ [Å] | $a_{cub}$ [Å] | $E_{cub} - E_{tet}$ [eV] per 4 atoms | Phase | $m_{tot}$ [$\mu_B$] per 4 atoms | Formula of 4-atom cell along z-axis | $m_{(O)}$ [$\mu_B$] | $m_{(T)}$ [$\mu_B$] | $m_{(T)}$ [$\mu_B$] |
|---|---|---|---|---|---|---|---|---|---|---|---|---|
| 0 | $Mn_3Ge$ | Reg = Inv | 3.73 | 7.09 | 5.74 | 0.10 | Tet | 1.01 | | −2.70 | 1.88 | 1.88 |
| | | | | | | | Cub | 1.00 | | 2.60 | −0.86 | −0.86 |
| 0.25 | $Mn_{2.75}Co_{0.25}Ge$ | $Mn_2CoGe$: Inv | 3.73 | 7.05 | 5.74 | 0.07 | Tet | 0.49 | $Mn_3Ge$ | −2.68 | 1.79 | 1.86 |
| | | | | | | | | | $Mn_3Ge$ | −2.67 | 1.86 | 1.84 |
| | | | | | | | | | $Mn_3Ge$ | −2.68 | 1.79 | 1.86 |
| | | | | | | | | | $Mn_2CoGe$ | −2.71 | 2.18 | −0.21 |
| | | | | | | | Cub | 1.5 | $Mn_3Ge$ | 2.64 | −0.79 | −0.83 |
| | | | | | | | | | $Mn_3Ge$ | 2.59 | −0.97 | −0.78 |
| | | | | | | | | | $Mn_3Ge$ | 2.59 | −0.79 | −0.78 |
| | | | | | | | | | $Mn_2CoGe$ | 2.59 | −0.75 | 0.79 |
| 0.5 | $Mn_{2.5}Co_{0.5}Ge$ | $Mn_2CoGe$: Inv | 3.73 | 7.01 | 5.74 | 0.04 | Tet | 0.01 | $Mn_3Ge$ | −2.69 | 1.70 | 1.85 |
| | | | | | | | | | $Mn_2CoGe$ | −2.67 | 2.16 | −0.20 |
| | | | | | | | Cub | 2.00 | $Mn_3Ge$ | 2.59 | −0.64 | −0.78 |
| | | | | | | | | | $Mn_2CoGe$ | 2.63 | −0.82 | 0.79 |

TABLE I-continued

Structure type, lattice constants, stability energy, total magnetic moment per formula unit (considering 4 atoms), and magnetic moment, m, of individual Mn and Co atoms. Individual m values refer to atoms of Co if highlighted in bold characters, and Mn if otherwise. Magnetic moments $m_{(O)}$ and $m_{(T)}$ specify individual atoms located at octahedrally coordinated (layer with the main group Ge atoms) and tetrahedrally coordinated sites in indicated 4-atom cells.

| x | Alloy | Reg/Inv | $a_{tet}$ [Å] | $c_{tet}$ [Å] | $a_{cub}$ [Å] | $E_{cub} - E_{tet}$ [eV per 4 atoms] | Phase | $m_{tot}$ [$\mu_B$ per 4 atoms] | Formula of 4-atom cell along z-axis | $m_{(O)}$ [$\mu_B$] | $m_{(T)}$ [$\mu_B$] | $m_{(T)}$ [$\mu_B$] |
|---|---|---|---|---|---|---|---|---|---|---|---|---|
| 1 | Mn$_2$CoGe | Inv | 3.74 | 6.88 | 5.74 | 0.07 | Tet | 0.97 | | 2.62 | −2.10 | 0.40 |
| | | | | | | | Cub | 3.00 | | 2.70 | −0.70 | 0.90 |
| 1.5 | Mn$_{1.5}$Co$_{1.5}$Ge | Mn$_2$CoGe: Inv MnCo$_2$Ge: Reg | — | — | 5.74 | — | Cub | 4.00 | Mn$_2$CoGe MnCo$_2$Ge | 2.87 2.84 | −0.95 1.05 | 0.96 1.05 |
| 2 | MnCo$_2$Ge | Reg | — | — | 5.74 | — | Cub | 5.00 | | 2.95 | 0.99 | 0.99 |

For the cubic phase, the magnetic moment was found to satisfy the Slater-Pauling rule for all x values that we studied. The Slater-Pauling rule states that the magnetic moment, m, per 4 atom unit cell varies with the number of the valence electrons, $N_v$, per 4 atom unit cell, namely, $m=N_v-24$. The individual calculated moments of the Mn and Co atoms located at the O and the two T sites are shown in Table I. Note that, for all compositions considered here, the O site is preferentially occupied by Mn (in both cubic and tetragonal phases) in agreement with the "lightest atom" rule, which states that the O site in cubic X$_2$YZ Heusler compounds should always be occupied by the X or Y atom having lower valence. Furthermore, the magnitude of the moment of the Mn atom on the O site is robust and shows only a small variation with Co composition. The sign of this moment changes according to whether this moment is dominant or not for the FiM case. The moments of the Mn and Co atoms on the T sites change significantly from the cubic to the tetragonal phase but they have similar values, independent of the Co content, for each of these phases, within the corresponding 4-atom unit cell building blocks. In both the cubic and tetragonal phases the Co atoms (which are always on the T sites) have their moments always aligned ferromagnetically with the Mn moments on the O sites, while the moments of the Mn atoms on the T sites are always aligned anti-parallel to the Mn moments on the O sites. When Co is added it substitutes for Mn atoms on T sites so that when x=2 there are no more Mn atoms on the T sites and the magnetic configuration becomes FM. In the cubic phase the net moment of Mn$_3$Ge has the same sign as the Mn moment on the O site. On the other hand, in the tetragonal phase the total moment of Mn$_3$Ge has the opposite sign as the Mn moment on the O site. Therefore, the addition of Co (again on the T site) initially reduces the total moment until at x=0.5 (FIG. 1B) the total moment is zero. Further increase in the Co content then causes the moment to increase (this trend is also observed experimentally in our sputter deposited films).

From the partial density of states (pDOS), that are calculated from the different electronic structures, we can extract a layer-dependent SP defined as follows:

$$SP=[pDOS(maj)-pDOS(min)]/[pDOS(maj)+pDOS(min)], \quad (1)$$

where pDOS(maj) and pDOS(min) are, respectively, the majority and minority spin polarized partial DOS calculated at the Fermi energy ($E_F$), for each layer in the unit cell. Note that each layer has two atoms, as shown in Table II. Here, the calculated SP is shown only for the ground state configuration. All the cubic phases, regardless of the Co content, are half-metallic (SP=1). Note that the SP of each layer in the unit cell for the compounds shown in Table II has the same sign, for all compositions and phases, and it always corresponds to the sign of the moment of the Mn atom on the O site (i.e. Mn—Ge layer). Thus, the polarization changes sign at x=1.

TABLE II

Bulk layer-by-layer P for different Co concentrations. Note that for x = 0, 1, 2 there are only 2 repeating layers. The lower energy configuration with lattice parameters from Table I is used for each x. The z position of each layer corresponds to its position along the c out-of-plane unit cell axis (refer to FIGS. 1A-1C).

| X | Alloy | Ground State | Layer z position | Layer name | m [$\mu_B$] | Layer-dependent SP | BZF Effect | Half-metal |
|---|---|---|---|---|---|---|---|---|
| 0 | Mn$_3$Ge | Tet | 0 | Mn—Ge | −2.7 | −0.63 | YES | NO |
| | | | 0.5 | Mn—Mn | 3.76 | −0.77 | | |
| 0.25 | Mn$_{2.75}$Co$_{0.25}$Ge | Tet | 0 | Mn—Ge | −2.68 | −0.40 | NO | NO |
| | | | 0.125 | Mn—Mn | 3.65 | −0.68 | | |
| | | | 0.25 | Mn—Ge | −2.67 | −0.63 | | |
| | | | 0.375 | Mn—Mn | 3.7 | −0.72 | | |
| | | | 0.5 | Mn—Ge | −2.68 | −0.62 | | |
| | | | 0.625 | Mn—Mn | 3.65 | −0.74 | | |
| | | | 0.75 | Mn—Ge | −2.71 | −0.30 | | |
| | | | 0.875 | Mn—Co | 1.97 | −0.52 | | |

TABLE II-continued

Bulk layer-by-layer P for different Co concentrations. Note that for x = 0, 1, 2 there are only 2 repeating layers. The lower energy configuration with lattice parameters from Table I is used for each x. The z position of each layer corresponds to its position along the c out-of- plane unit cell axis (refer to FIGS. 1A-1C).

| X | Alloy | Ground State | Layer z position | Layer name | m [$\mu_B$] | Layer-dependent SP | BZF Effect | Half-metal |
|---|---|---|---|---|---|---|---|---|
| 0.5 | $Mn_{2.5}Co_{0.5}Ge$ | Tet | 0 | Mn—Ge | −2.69 | −0.46 | NO | NO |
|   |   |   | 0.25 | Mn—Mn | 3.55 | −0.75 |   |   |
|   |   |   | 0.5 | Mn—Ge | −2.67 | −0.54 |   |   |
|   |   |   | 0.75 | Mn—Co | 1.96 | −0.56 |   |   |
| 1 | $Mn_2CoGe$ | Tet | 0 | Mn—Ge | 2.62 | 0.50 | NO | NO |
|   |   |   | 0.5 | Mn—Co | −1.7 | 0.85 |   |   |
| 1.5 | $Mn_{1.5}Co_{1.5}Ge$ | Cub | 0 | Mn—Ge | 2.87 | 1.00 | YES | YES |
|   |   |   | 0.25 | Mn—Co | 0.01 | 1.00 |   |   |
|   |   |   | 0.5 | Mn—Ge | 2.84 | 1.00 |   |   |
|   |   |   | 0.75 | Co—Co | 2.1 | 1.00 |   |   |
| 2 | $MnCo_2Ge$ | Cub | 0 | Mn—Ge | 2.95 | 1.00 | YES | YES |
|   |   |   | 0.5 | Co—Co | 1.98 | 1.00 |   |   |

B. Brillouin Zone Spin Filtering Effect

The so-called Brillouin zone spin filtering (BZF) effect in a ME/MgO/ME MTJ system occurs if a magnetic electrode (ME) has electronic states at $E_F$ along the Γ-Z line in one spin channel, $\sigma_1$, and does not have states at $E_F$ along the Γ-Z line in the other spin channel, $\sigma_2$. The Γ-Z line in the Brillouin zone (BZ) is the line along the $k_z$ direction with in-plane wavevector $k_\parallel=(k_x, k_y)=0$. It is well known that the smallest (at a given $k_\parallel$) attenuation constant $\gamma(k_\parallel)$ of an MgO insulating spacer, for evanescent states propagating along the z direction with energies within the MgO band gap, reaches a minimum, $\gamma_0$, at $k_\parallel=0$. When $k_\parallel$ increases, $\gamma(k_\parallel)$ increases as $\gamma(k_\parallel)=\gamma_0+\alpha k_\parallel^2$ with $\alpha>0$ ($\alpha$ is a coefficient of the Taylor expansion for small $k_\parallel$). Therefore, considering the ME described above, the evanescent states in the $\sigma_1$ spin channel at $E_F$ that propagate along the z direction with $k_\parallel=0$ will decay inside MgO as $\exp[-\gamma_0 z]$, whereas the evanescent states in the $\sigma_2$ spin channel at $E_F$ will decay as $\exp[(-\gamma_0+\alpha k_\parallel^2)z]$ with $k_\parallel>0$, since the $\sigma_2$ spin channel does not have states at $E_F$ with $k_\parallel=0$. As a result, the TMR of a ME/MgO/ME MTJ increases exponentially with increasing MgO thickness, $d_{MgO}$, as $$TMR \propto \exp[2\alpha \tilde{k}_\parallel^2 d_{MgO}], \quad (2)$$

where $\tilde{k}_\parallel$ is the smallest $k_\parallel \neq 0$ vector for which the ME has states in the $\sigma_2$ spin channel at $E_F$. Such exponential dependence of the TMR on $d_{MgO}$ is much stronger than the $TMR \propto d_{MgO}^n$ dependence in conventional Fe/MgO/Fe MTJs arising from the symmetry spin filtering effect[22, 23], where the power factor n can only take three values n=0,1,2 for MTJ systems with square symmetry in the xy-plane. For simplicity, we assumed above that both electrodes are made from the same ME material but, in general, it is enough to have just one electrode with the above properties to predict the exponential increase of the TMR with $d_{MgO}$ thanks to the BZF effect.

C. BZF Effect in Ordered $Mn_{3-x}Co_xGe$ Compounds with x=0, 0.25, 0.5, 1, 1.5 and 2.

FIGS. 2a-1 show the majority and minority electron bands along the Γ-Z line in the three dimension (3D) BZ for ordered bulk $Mn_{3-x}Co_xGe$ compounds having the structures described in Table I, for x=0, 0.25, 0.5, 1 having a tetragonal lowest energy configuration, and x=1.5, 2 having a cubic lowest energy configuration. The bands structures were calculated using the VASP program with projector augmented wave (PAW) potentials and the Perdew-Burke-Ernzerhof (PBE) generalized gradient approximation (GGA)/DFT.

Bulk $Mn_3Ge$ (x=0) has several majority bands (FIG. 2a) that cross $E_F$ along the Γ-Z line, while minority states (FIG. 2g) do not have any bands crossing $E_F$ along the Γ-Z line. Therefore, this compound satisfies the BZF conditions described above and MTJ devices formed using an MgO tunnel barrier and $Mn_3Ge$ as one of the electrodes should display an exponentially increasing TMR in the limit of large $d_{MgO}$ (see next subsection D). Instead, the remaining three tetragonal compounds—$Mn_{3-x}Co_xGe$ with x=0.25, 0.5, and 1—have bands that cross $E_F$ along the Γ-Z line in both the majority and minority spin channels (FIGS. 2b-d and FIGS. 2h-j), thus these compounds do not satisfy the BZF conditions (as specified in Table II).

The $Mn_{1.5}Co_{1.5}Ge$ (x=1.5) and $MnCo_2Ge$ (x=2) compounds are predicted to have a cubic ground state configuration with a half-metallic character (100% spin polarization for every layer, as shown in Table II). These compounds have an energy gap at $E_F$ in the minority channel not only for wave vectors k along the Γ-Z line (as shown in FIGS. 2k-l) but for all k wave vectors in the 3D-BZ.

D. BZF Effect and DOS in Disordered $Mn_{3-x}Co_xGe$ Compounds with x≤0.25

Disordered $Mn_{3-x}Co_xGe$ compounds with small values of 0≤x≤0.25 were modeled using the virtual crystal approximation (VCA) in a framework of the full-potential linear muffin-tin orbitals (LMTO) approach using the Barth-Hedin local density approximation (LDA)/DFT functional. Within this approximation, the charge of the nucleus, $Z_{Mn}=25$, of the Mn atoms of an ordered $Mn_3Ge$ system is substituted by the charge of a 'virtual' atom $$Z=(1-x/3)Z_{Mn}+(x/3)Z_{Co}, \quad (3)$$

which mimics the random occupation of a x/3 share of Mn sites by Co atoms ($Z_{Co}=27$) in a disordered $Mn_{3-x}Co_xGe$ system. The VCA calculations were performed using the experimentally determined lattice constants from earlier studies of the tetragonal $Mn_3Ge$ Heusler compound (a=3.816 Å and c=7.261 Å).

The majority and minority electron bands along the Γ-Z line were calculated for x=0.00, 0.05, 0.10, 0.15, 0.20, and 0.25. It was found that only for x=0.00, 0.05, 0.10, and 0.15 there are no minority bands crossing $E_F$ along the Γ-Z line, while for x=0.20 and 0.25 there is one minority band that crosses $E_F$ along the Γ-Z line. Therefore, the calculations for both ordered and disordered $Mn_{3-x}Co_xGe$ systems indicate that the BZF effect occurs only for small $x<x_c$ with estimated $x_c \approx 0.2$. Moreover, the majority and minority DOS of the $Mn_{3-x}Co_xGe$ compounds calculated for x=0.00, 0.05, 0.10, 0.15, 0.20, and 0.25 within the VCA indicate that the large negative SP is preserved for all x considered here.

E. TMR Calculations for $Mn_{3-x}Co_xGe/MgO/Fe$ Systems with x=0 and x=0.25

In order to investigate the different regimes of the TMR behavior for $x<x_c$ and $x>x_c$ due to the presence and absence of the BZF effect at the $Mn_{3-x}Co_xGe/MgO$ interface, we performed calculations of the transmission functions of the $Mn_{3-x}Co_xGe/MgO/Fe$ MTJ systems with x=0 and x=0.25 using a tight-binding linear muffin-tin orbital method in the atomic sphere approximation (LMTO-ASA) with the local density approximation of DFT for the exchange-correlation energy. For the x=0.25 case we used the VCA as described above.

Regarding the $Mn_3Ge/MgO/Fe$ MTJ, the in-plane lattice constant was fixed to the experimental lattice constant for bulk tetragonal $Mn_3Ge$ (a=3.816 Å). The relaxed position of atoms at the $Mn_3Ge/MgO$ interfaces (for both Mn—Mn and Mn—Ge terminations) was determined using the VASP molecular dynamic program. The O-top configuration was found to be the most stable configuration (as compared with Mg-top and hollow) for both terminations. For the MgO/Fe interface, the atomic positions from literature were used. These same atomic positions were used for the $Mn_{2.75}Co_{0.25}Ge/MgO/Fe$ MTJ system. Lastly, the number of MgO layers, $N_{MgO}$, was varied from 2 to 12.

Figure 3B:
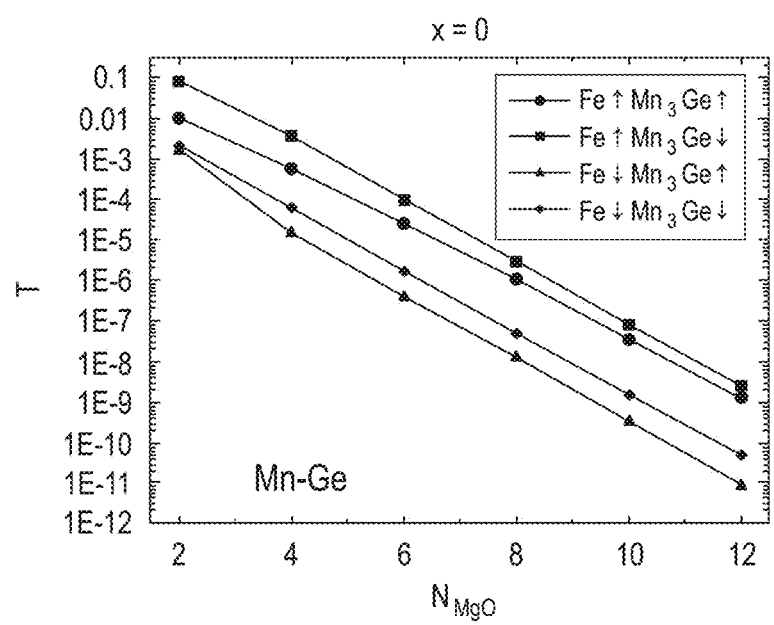

FIGS. 3A-3F depict transmission functions (T) calculated at $E_F$ for (x=0) $Mn_3Ge/MgO/Fe$ and (x=0.25) $Mn_{2.75}Co_{0.25}Ge/MgO/Fe$ MTJs with Mn—Mn (a,d) and Mn—Ge (b,e) terminations at the Heusler/MgO interface as a function of $N_{MgO}$. For each termination and both x values four functions are presented: $T[Fe(\uparrow)Heusler(\uparrow)]$ and $T[Fe(\downarrow)Heusler(\downarrow)]$ transmissions for the parallel configuration, and $T[Fe(\uparrow)Heusler(\downarrow)]$ and $T[Fe(\downarrow)Heusler(\uparrow)]$ transmissions for the antiparallel configuration. TMR of the $Mn_3Ge/MgO/Fe$ (c) and $Mn_{2.75}Co_{0.25}Ge/MgO/Fe$ (f) MTJs versus $N_{MgO}$. The TMR with Mn—Mn (Mn—Ge) terminations is shown in square symbols (triangles), while the TMR considering an equal number of Mn—Mn and Mn—Ge terminations is shown in circular symbols. The calculations for the x=0.25 case were carried out using the VCA. FIGS. 3A and 3B show the transmission functions (T) calculated at $E_F$ for the $Mn_3Ge/MgO/Fe$ MTJ with Mn—Mn and Mn—Ge terminations, respectively, at the $Mn_3Ge/MgO$ interface as a function of $N_{MgO}$. For each termination four functions are presented: $T[Fe(\uparrow)Mn_3Ge(\uparrow)]$ and $T[Fe(\downarrow)Mn_3Ge(\downarrow)]$ transmissions in parallel configuration (P) and $T[Fe(\uparrow)Mn_3Ge(\downarrow)]$ and $T[Fe(\downarrow)Mn_3Ge(\uparrow)]$ transmissions in anti-parallel configuration (AP) (the majority and minority spin channels of each electrode are indicated with up and down arrows, respectively). As one can see in FIGS. 3A and 3B, the transmission through the Fe majority channel is much larger than the transmission through the Fe minority channel for both P and AP configurations and for both Mn—Mn and Mn—Ge terminations. This is a consequence of the well-known symmetry spin filtering effect arising at the Fe/MgO interface. Due to the dominant contribution of majority Fe electrons to both the P and AP transmissions, the TMR sign and magnitude of the overall $Mn_3Ge/MgO/Fe$ MTJ system is thus determined by the sign and magnitude of the tunneling spin polarization from the $Mn_3Ge/MgO$ interface. The latter is, in turn, determined by a balance between the BZF effect that favors a positive TMR with increasing $N_{MgO}$, and the large negative SP of bulk $Mn_3Ge$, that favors a negative TMR. As seen in FIGS. 3A and 3B the $T[Fe(\uparrow) Mn_3Ge(\downarrow)]$ transmissions (square symbols) decay exponentially as a function of $N_{MgO}$ with a larger attenuation constant (steeper slopes) than the attenuation constant of the $T[Fe(\uparrow) Mn_3Ge(\uparrow)]$ transmission functions (circular symbols) for both Mn—Mn and Mn—Ge terminations. This is due to the BZF effect—absence of bands in the minority channel of bulk $Mn_3Ge$ crossing $E_F$ along the Γ-Z line of the BZ, and presence of such bands in the majority channel of bulk $Mn_3Ge$.

Figure 3C:
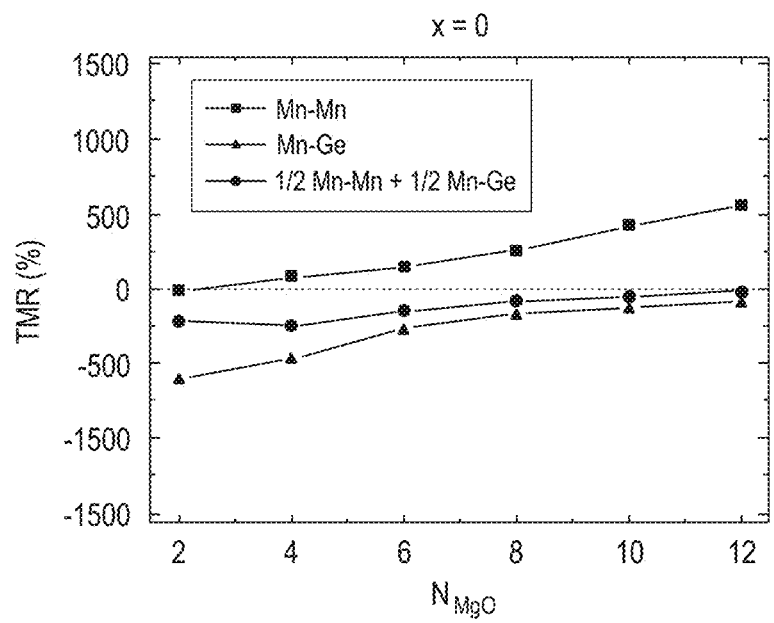

The TMR as a function of $N_{MgO}$ for both terminations is shown in FIG. 3C. Here, the TMR is defined as:

$$TMR=(T_P-T_{AP})/\min(T_P,T_{AP}), \qquad (4)$$

where $T_P=T[Fe(\uparrow) Mn_3Ge(\uparrow)]+T[Fe(\downarrow) Mn_3Ge(\downarrow)]$ and $T_{AP}=T[Fe(\uparrow) Mn_3Ge(\downarrow)]+T[Fe(\downarrow) Mn_3Ge(\uparrow)]$ are the total transmissions at $E_F$ for the P and AP configurations, respectively. Qualitatively, the behavior of the TMR presented on FIG. 3C can be explained as follows. While the native spin polarization of $Mn_3Ge$ is negative and comparable in absolute value for both the Mn—Mn and Mn—Ge termination layers (see Table II), the Mn—Ge layer shows a much larger absolute value of the negative SP when only the DOS projected to the atomic orbitals with m=0 are considered as compared to the Mn—Mn layer (here m is the z-axis projection of the angular momentum). Since the evanescent states of MgO having the smallest attenuation constants for $k_\parallel$ in the vicinity of the Γ-point are mostly composed of m=0 orbitals (and since these states prefer to couple more strongly to m=0 orbitals rather than m≠0 orbitals of the Heusler termination layer due to symmetry constrains), the large difference in SP of the DOS projected to m=0 orbitals of the Mn—Ge and Mn—Mn layers favors a more negative TMR of the $Mn_3Ge/MgO/Fe$ MTJ with Mn—Ge terminations as compared to the one with Mn—Mn terminations, for the same $N_{MgO}$. Indeed, FIG. 3C shows that the TMR calculated for the Mn—Ge termination (triangular symbols) is negative for all $N_{MgO}$ considered here, while it is positive (for $N_{MgO}>2$) for the Mn—Mn termination case (square symbols). Since the BZF effect becomes stronger as the barrier thickness increases, the positive TMR in the case of Mn—Mn termination increases, while the negative TMR in the case of Mn—Ge termination becomes less negative and, at sufficiently large $N_{MgO}$, it will eventually change sign.

In real MTJ devices there will be inevitable atomic scale fluctuations in the morphology of the $Mn_3Ge$ Heusler layer that give rise to regions with Mn—Mn and Mn—Ge terminations that will interface the MgO barrier. The simplest way to model such fluctuations is to average the transmission functions over the different terminations (separately for P and AP), assuming that the MgO thickness is the same across the device. The TMR calculated from this simple model with an assumption of equal areas occupied by Mn—Mn and Mn—Ge terminations is also shown in FIG. 3C (circular symbols). The calculations give a negative TMR since both $T_P$ and $T_{AP}$ for the Mn—Ge termination are larger than those for the Mn—Mn termination (for all $N_{MgO}$ considered).

Figure 3D:
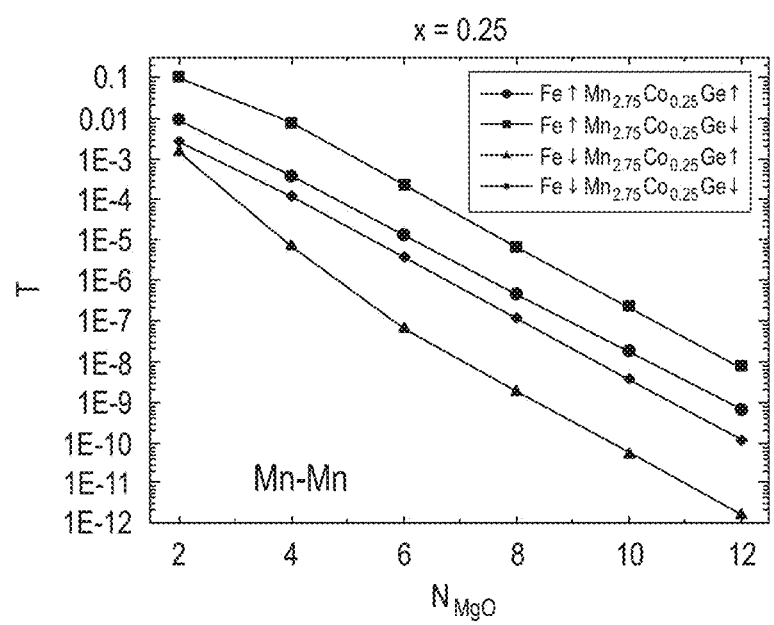
Figure 3E:
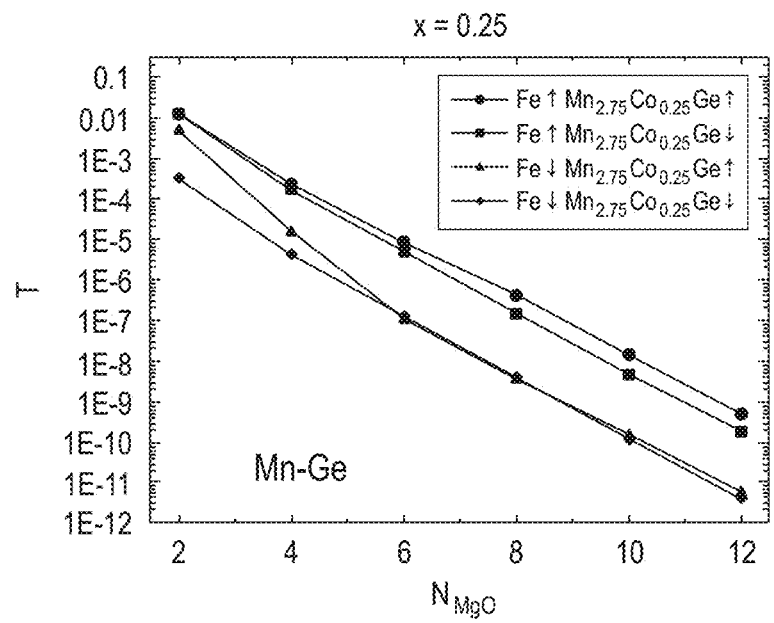
Figure 3F:
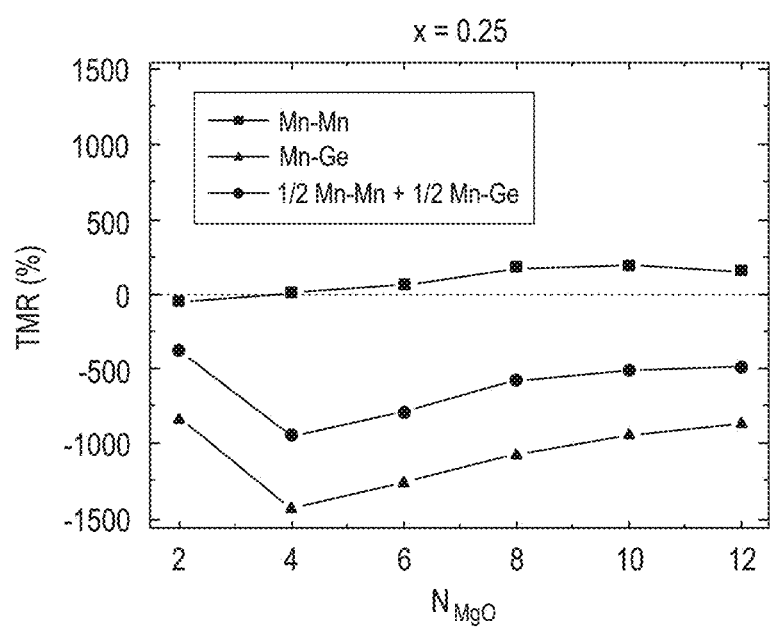

FIGS. 3D and 3E show the transmission functions of the $Mn_{2.75}Co_{0.25}Ge/MgO/Fe$ MTJ system for both Mn—Mn and Mn—Ge terminations, respectively, calculated at $E_F$ using the VCA for the disordered $Mn_{2.75}Co_{0.25}Ge$ compound (for simplicity, we continue to use 'Mn—Ge' and 'Mn—Mn' notations for the termination layer that contains and does not contain the Co atom, respectively). It is seen that, similarly to the x=0 case, the dominant contribution to both P and AP transmissions comes from the majority Fe channel. Another similarity is that the corresponding TMR, shown in FIG. 3F, is positive for the Mn—Mn termination (for $N_{MgO}>2$) and negative for the Mn—Ge termination. However, the main difference between the $Mn_3Ge$ and $Mn_{2.75}Co_{0.25}Ge$ cases is that the attenuation constants of the $T[Fe(\uparrow) Mn_{2.75}Co_{0.25}Ge(\uparrow)]$ and $T[Fe(\uparrow) Mn_{2.75}Co_{0.25}Ge(\downarrow)]$ transmission functions are similar (for both Mn—Mn and Mn—Ge terminations), due to the suppression of the BZF effect for x=0.25. In the latter case, the positive TMR for the Mn—Mn termination reaches a maximum of ~200% at $N_{MgO}=10$ and starts to decline at $N_{MgO}=12$ (FIG. 3F, square symbols), while the TMR for the Mn—Mn termination in the x=0 case (FIG. 3C, square symbols) is much larger (TMR 550% at the largest $N_{MgO}$ considered, i.e. $N_{MgO}=12$) and steadily increases with $N_{MgO}$ due to the BZF effect. Since there is no compensation between the BZF mechanism and the negative SP for the x=0.25 case, the absolute value of the (negative) TMR for the Mn—Ge termination is greater than 800% for all considered MgO thicknesses (FIG. 3F, triangular symbols), and the absolute value of the TMR in the case of equal areas occupied by Mn—Mn and Mn—Ge terminations (FIG. 3F, circular symbols) is larger than 350% for all $N_{MgO}$ values considered here, with the largest TMR of 1000% for $N_{MgO}=4$. Therefore, the elimination of the compensation between the SP and BZF effects results, indeed, in a significant increase of the TMR of a $Mn_{3-x}Co_xGe/MgO/Fe$ p-MTJ with x=0.25 (TMR>500%) as compared to that for x=0 (TMR<100%) for the same range of MgO thicknesses ($N_{MgO}=8-12$).

Experimental Study

Thin Film Growth

The samples were prepared in an ultra-high vacuum magnetron sputtering chamber with a base pressure of $4 \times 10^{-10}$ Torr. The film stacks used for this study were as follows: Si(001)/250 Å $SiO_2$/200 Å TaN/100 Å $IrMn_3$/300 Å $Mn_{3-x}Co_xGe$/30 Å Ta. The $TaN/IrMn_3$ bilayer underlayer was used to promote the (001) crystallographic orientation of the Heusler films, and the thin Ta cap serves as a protective layer. The TaN layer, which was formed by reactive magnetron sputtering of a Ta target in a mixture of Ar and $N_2$ gases, induces the (001)-textured growth of $IrMn_3$, which would otherwise favor the (111) orientation when deposited directly on the amorphous $SiO_2$ surface. The $IrMn_3$ film and the Ta capping layer were deposited by ion-beam sputtering using Kr. The $Mn_{3-x}Co_xGe$ films were grown at 3 mTorr (using Ar) either by sputtering of a single $Mn_3Ge$ target (x=0) or by co-sputtering of Mn, Co and $Co_{10}Mn_{45}Ge_{45}$ targets (0<x≤2), using a 3-step process: an initial 20 Å of $Mn_{3-x}Co_xGe$ layer was deposited at 450° C., followed by the deposition of a 280 Å $Mn_{3-x}Co_xGe$ layer at 150° C., and final in-situ anneal at 450° C. for 1-2 h in vacuum. All the other layers were deposited at RT. All the films were smooth with root-mean square surface roughness of less than 7 Å. The ratio between Mn and Co in the $Mn_{3-x}Co_xGe$ films was tuned by varying the powers of the Mn and Co magnetron guns while keeping constant the power of the $Co_{10}Mn_{45}Ge_{45}$ magnetron gun.

Measurement Methods

The film compositions were measured by Rutherford backscattering spectrometry (RBS) measurements, while the film structures were investigated by x-ray diffraction (XRD) measurements using a Bruker D8 General Area Detector Diffraction System (GADDS) with Cu Kα radiation. Atomic force microscopy (AFM) measurements were carried out using a Bruker Icon Dimension with ScanAsyst system to determine the sample surface roughness. The in-plane and out-of-plane magnetic properties were investigated using a Quantum Design superconducting quantum interference device vibrating sample magnetometer (SQUID-VSM) at RT, with applied magnetic fields of up to ±7 T.

Structure and Magnetic Properties

Figure 4:
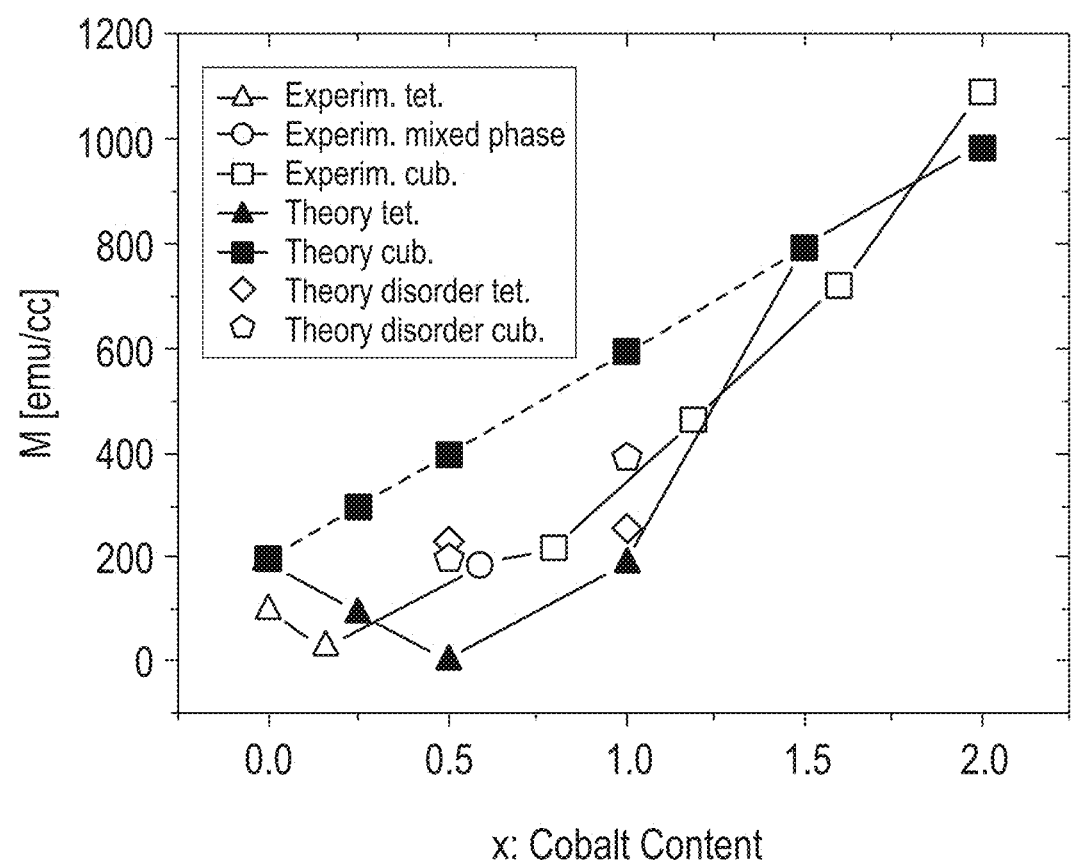
FIG. 4 depicts experimental and theoretical magnetization of embodiments of $Mn_{3-x}Co_xGe$ compounds.

FIG. 4 summarizes both the experimental (open symbols with lines) and the calculated (closed symbols and open symbols without lines) magnetization, M, of the $Mn_{3-x}Co_xGe$ compounds. Squares and triangles correspond to cubic and tetragonal structures respectively, while the circle corresponds to a mixed-phase compound. For each calculated $Mn_{3-x}Co_xGe$ compound, the theoretical M values are shown for both the ground state and the higher energy state (where both exist). In agreement with the theoretical predictions, we experimentally observe that with increasing Co content the crystal structure changes from tetragonal to cubic, and the total magnetic moment is consistent with a change from a FiM to a FM configuration (open symbols with lines). Although the experimental M values for films with x=0.6 and 0.8 seem to be in disagreement with the theory, further computational studies of 'energetically-unfavorable' atomic configurations of $Mn_{2.5}Co_{0.5}Ge$ (x=0.5) and $Mn_2CoGe$ (x=1) compounds (i.e. systems with Co atoms located not only at T sites but also at 'energetically-unfavorable' O sites) reveal that these systems have M values (open symbols without lines in FIG. 4) intermediate to those of the corresponding tetragonal and cubic systems in the lowest-energy configuration. Note that in Table I the energy difference between the cubic and tetragonal structures ($E_{cub} - E_{tet}$) for compounds with 0<x≤1 is relatively small, and is close to the thermal energy of the films' growth temperature (~0.04 eV). These results suggest that our $Mn_{3-x}Co_xGe$ films have a significant degree of atomic disorder. This is a common occurrence for thin films of Heusler compounds and can strongly affect many of their properties both within the bulk and at interfaces.

Figure 5A:
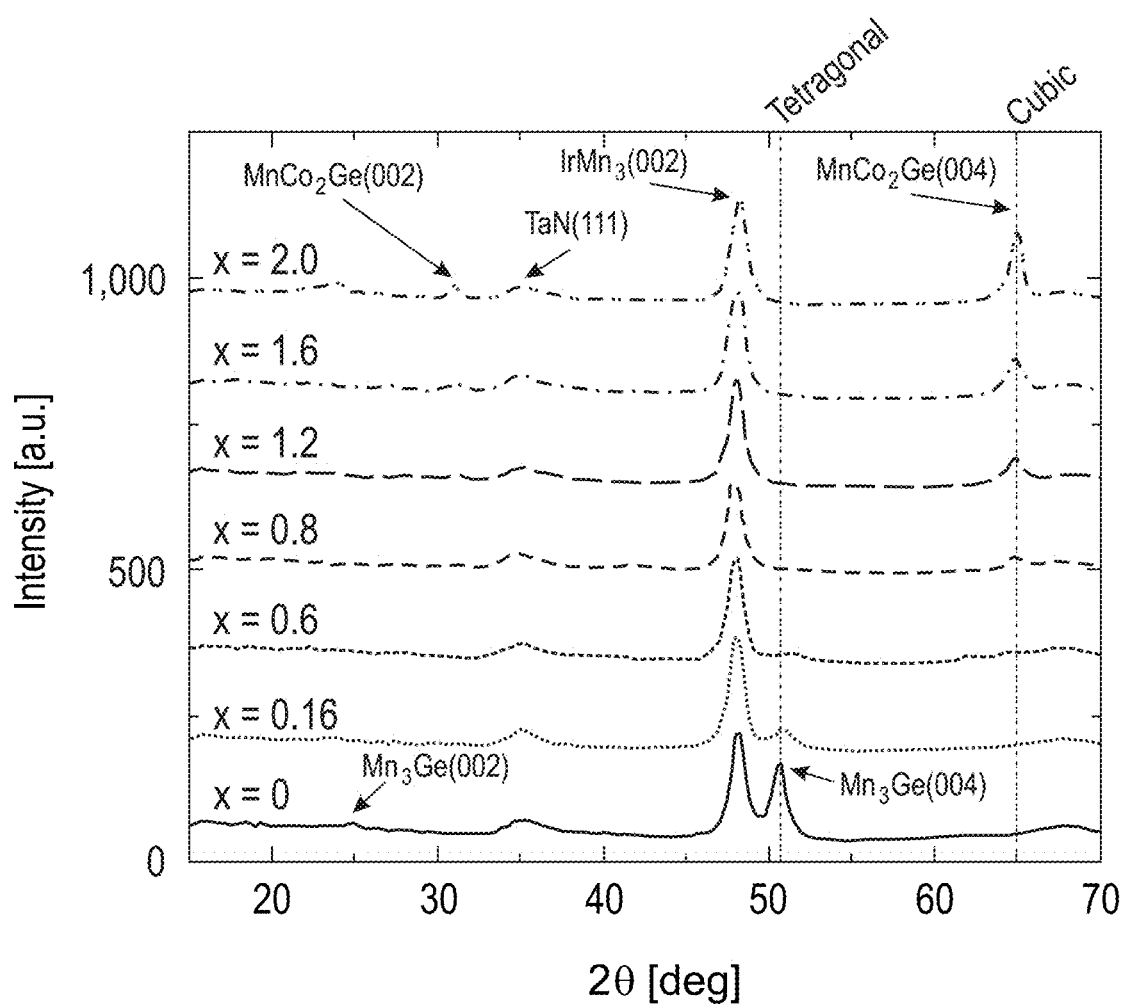
FIGS. 5A-5B indicate x-ray diffraction measurements for an exemplary embodiment of a device.
Figure 5B:
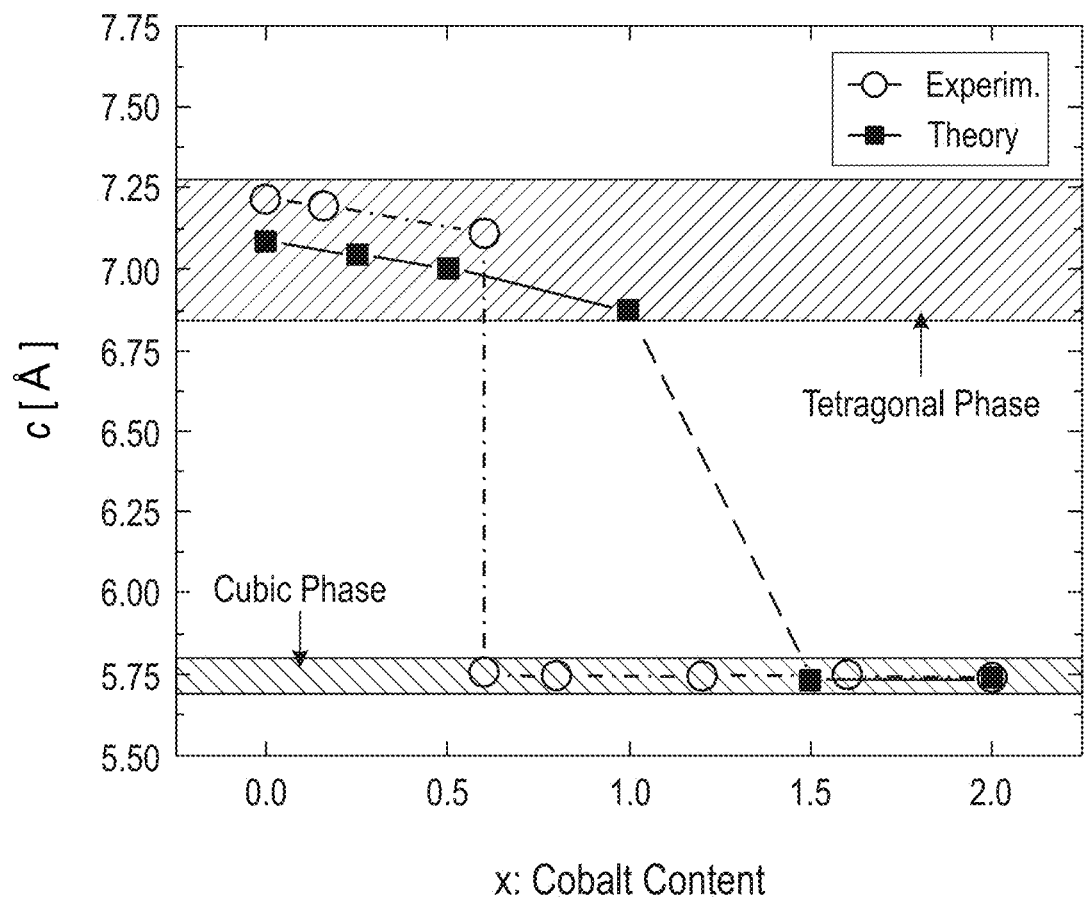

FIG. 5A illustrates the out-of-plane XRD θ-2θ measurements of the 300 Å thick $Mn_{3-x}Co_xGe$ films for different x values. The vertical dashed lines labelled as 'Tetragonal' and 'Cubic' are guides to the eyes. FIG. 5B summarizes the c lattice parameters extracted from FIG. 5A with the corresponding values from DFT calculations. The experimental c lattice constants extrapolated from (a) are illustrated with black empty circles, while the theoretical c lattice constants are shown using solid squares. The cross-hatched areas are guides to the eyes. The undoped $Mn_3Ge$ film (x=0) displays a pure tetragonal structure with a (004)-oriented Bragg peak at $2\theta_{tet-(004)} \sim 50.5°$, corresponding to an out-of-plane lattice constant of $c_{tet} \sim 7.22$ Å, in agreement with previous reports. The $Mn_3Ge$ (002) superlattice peak is also observed ($\theta_{tet-(002)} \sim 24.5°$), which is a fingerprint of alternating layers within the unit cell having a distinct character (consistent with Mn—Mn and Mn—Ge layers in the fully ordered compound). As the Co concentration increases up to x=0.6, the (004) peak linearly shifts to higher 2θ angles, indicating a linear decrease in the elongated axis of the tetragonal unit cell (see FIG. 5B). Only the film with x=0.6 (dashed line in FIG. 5A) shows a mixed-phase structure: (004) Bragg reflections corresponding to both tetragonal and cubic phases are found. A further increase in Co content (0.6<x≤2) results in complete disappearance of the tetragonal peak and stabilization of the cubic phase ($2\theta_{cub-(002)} \sim 31°$ and $2\theta_{cub-(004)} \sim 65°$), with lattice constant $c_{cub}$ 5.75 Å (FIG. 5B), in agreement with single crystal $L2_1$-cubic $MnCo_2Ge$ Heusler films grown on GaAs(001) substrates by molecular beam epitaxy.

Figure 6A:
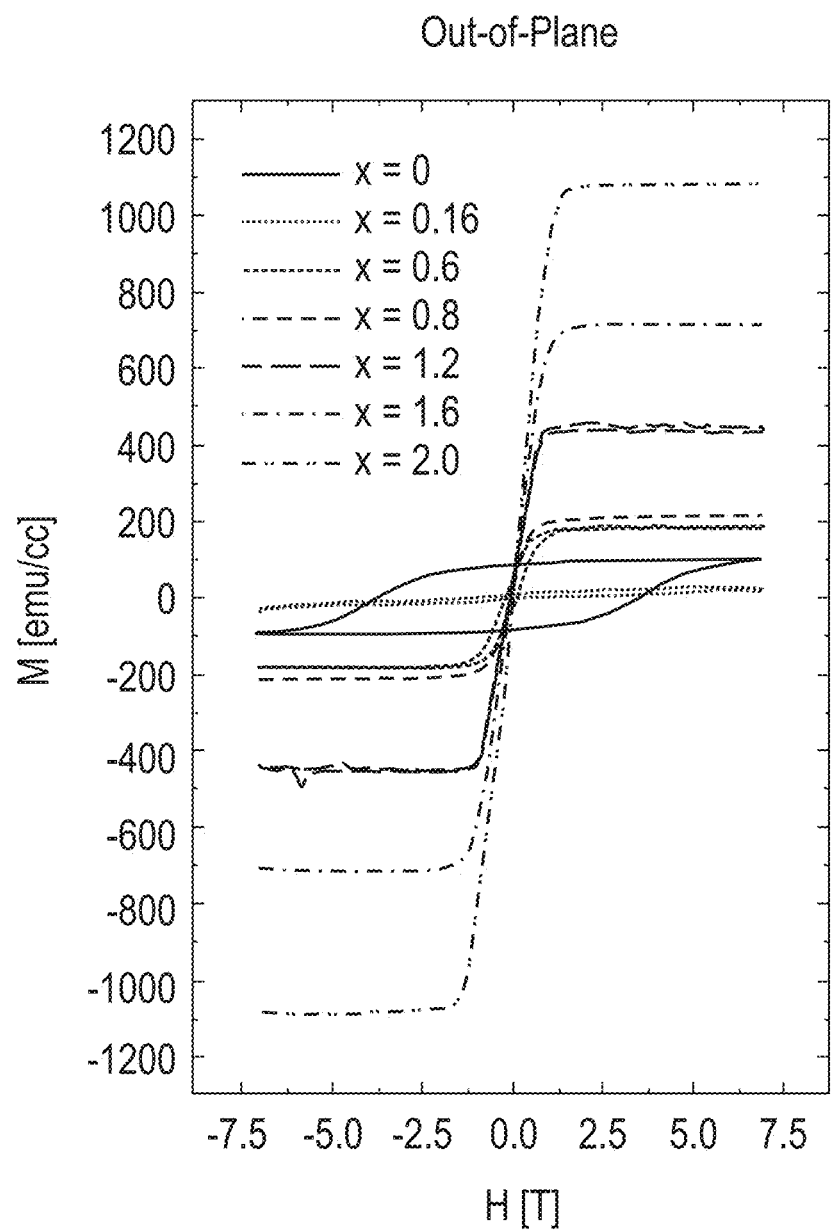
FIGS. 6A and 6B illustrate out-of-plane and in-plane magnetic properties of an exemplary embodiment of a device.
Figure 6B:
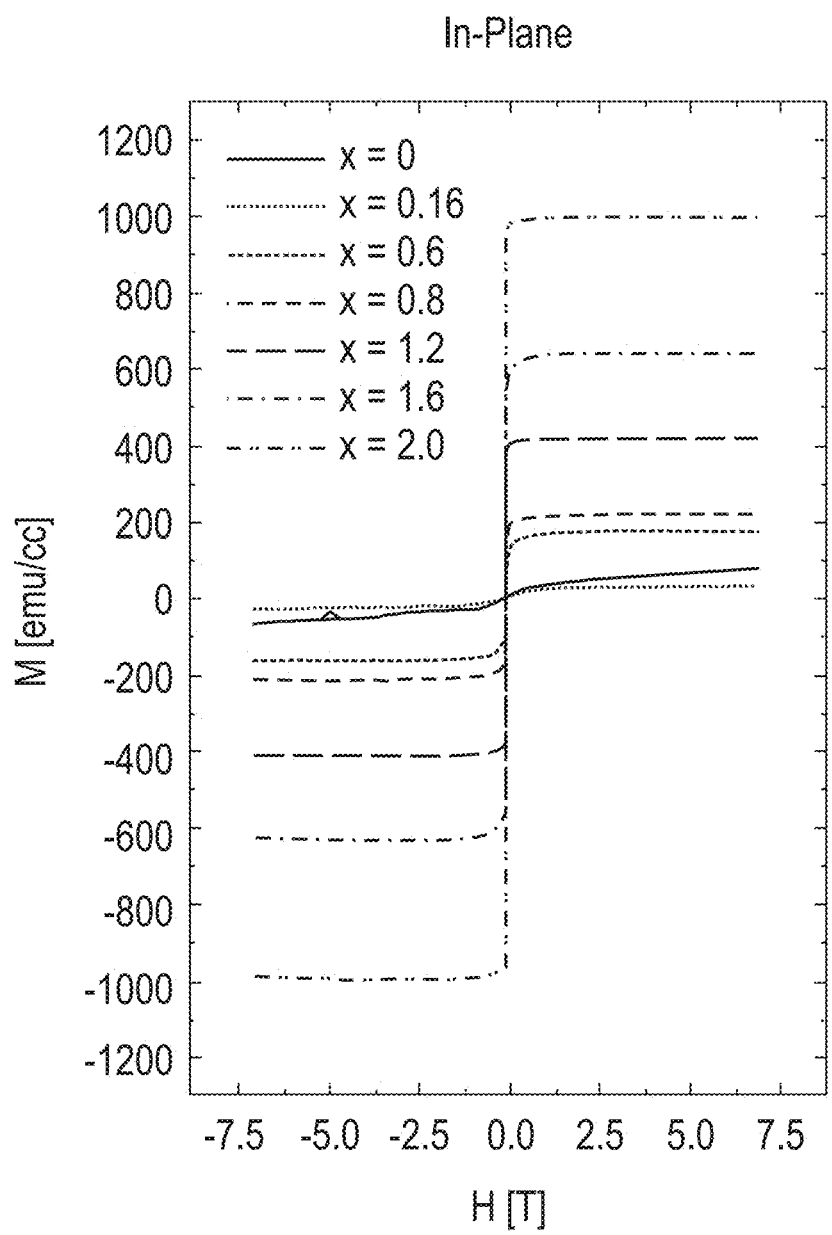
Figure 7:
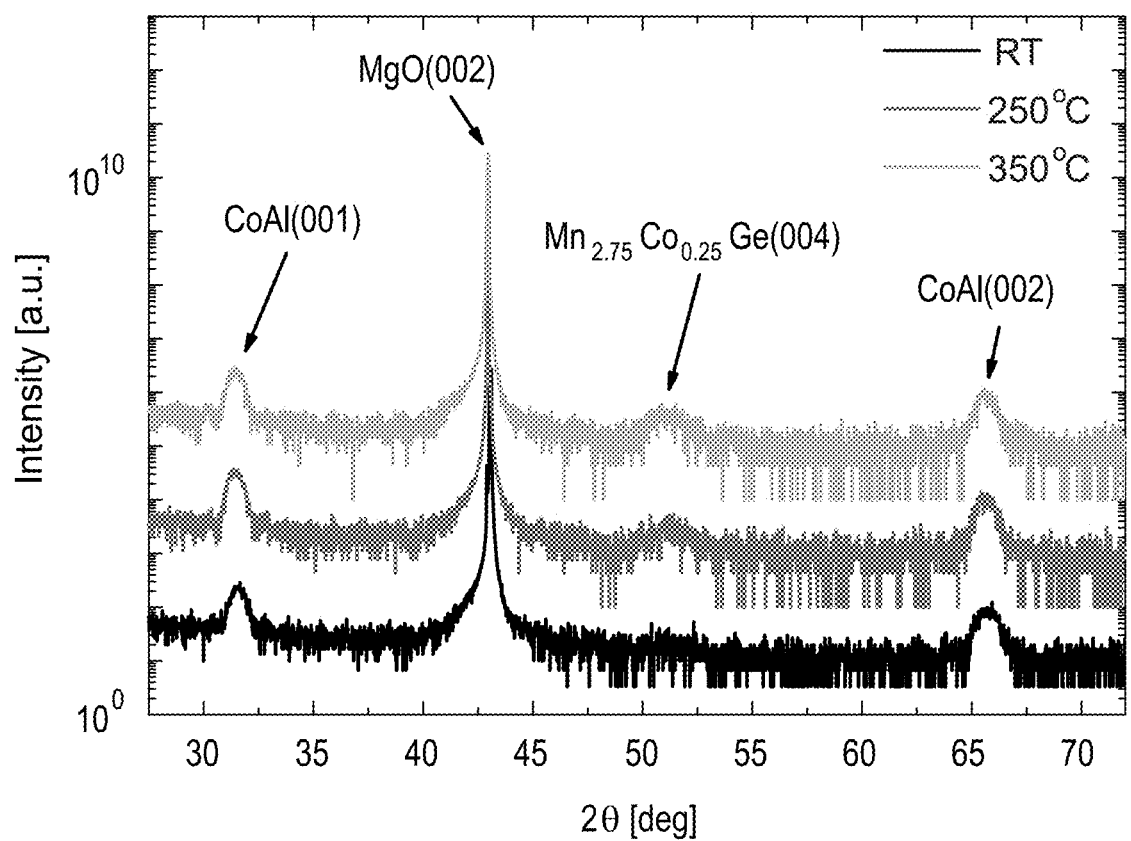
FIG. 7 illustrates X-ray diffraction measurements for an exemplary embodiment of a device.

FIGS. 6A-6B illustrate out-of-plane (FIG. 6A) and in-plane (FIG. 6B) M vs. H hysteresis loops of the 300 Å thick $Mn_{3-x}Co_xGe$ films, measured by SQUID-VSM at 300 K. FIG. 7 depicts x-ray diffraction θ-2θ scans at room temperature of the 200 Å thick $Mn_{3-x}Co_xGe$ films for x=0.25 grown at room temperature (black line), 250° C. (dark gray line) and 350° C. (light gray line). The structural transition from tetragonal to cubic and the associated loss of the broken symmetry of the crystal structure upon Co doping contributes to change the film's magnetic anisotropy from perpendicular to in-plane. This is confirmed by M vs. H (magnetization vs. applied magnetic field) hysteresis measurements at 300K of the $Mn_{3-x}Co_xGe$ films in both out-of-plane (FIG. 6A) and in-plane (FIG. 6B) sample configurations. In FIG. 6A, the tetragonal $Mn_3Ge$ (solid black line) film displays PMA with large coercive field, $H_C$~3.6 T, and low magnetization, $M_S$~100 emu/cc, a signature of its FiM structure. While the x=0.16 film (dotted line) shows a tetragonal crystal structure, the magnetic moment is too small to display a clear PMA hysteresis loop, but films with higher Co content (x≥0.8) show an in-plane magnetic anisotropy and a FM configuration, as expected.

Alternatively, tetragonal $Mn_{3-x}Co_xGe$ films with their c-axis largely coincident with film normal can be grown on underlayers which comprise of CoAl or CoGa or CoGe or CoSn or a layer of Co and at least one other element preferably Al; or Al alloyed with Ga, Ge, Sn or any combination thereof, such as AlSn, AlGe, AlGaGe, AlGaSn, AlGeSn, and AlGaGeSn. These type of underlayers could be referred to as templating layer. FIG. 7 illustrates the out-of-plane XRD θ-2θ measurements of the $Mn_{3-x}Co_xGe$ films for x=0.25 grown at room temperature (RT), 250° C., and 350° C. on MgO (001) substrates with CoAl templating layer. The material stack for these films was MgO (001)/20 Å MgO/100 Å CoAl/200 Å $Mn_{2.75}Co_{0.25}Ge$/20 Å MgO/20 Å Ta. The composition of the CoAl layer was $Co_{1-y}E_y$, with y being in the range from 0.45 to 0.55. The presence of $Mn_{2.75}Co_{0.25}Ge$ (004) peak at 2θ=~51° indicates growth of tetragonal phase of the Heusler film on CoAl templating layer. The CoAl templating layer promotes growth of ultra-thin Heusler compound films with bulk like properties.

Figure 8A:
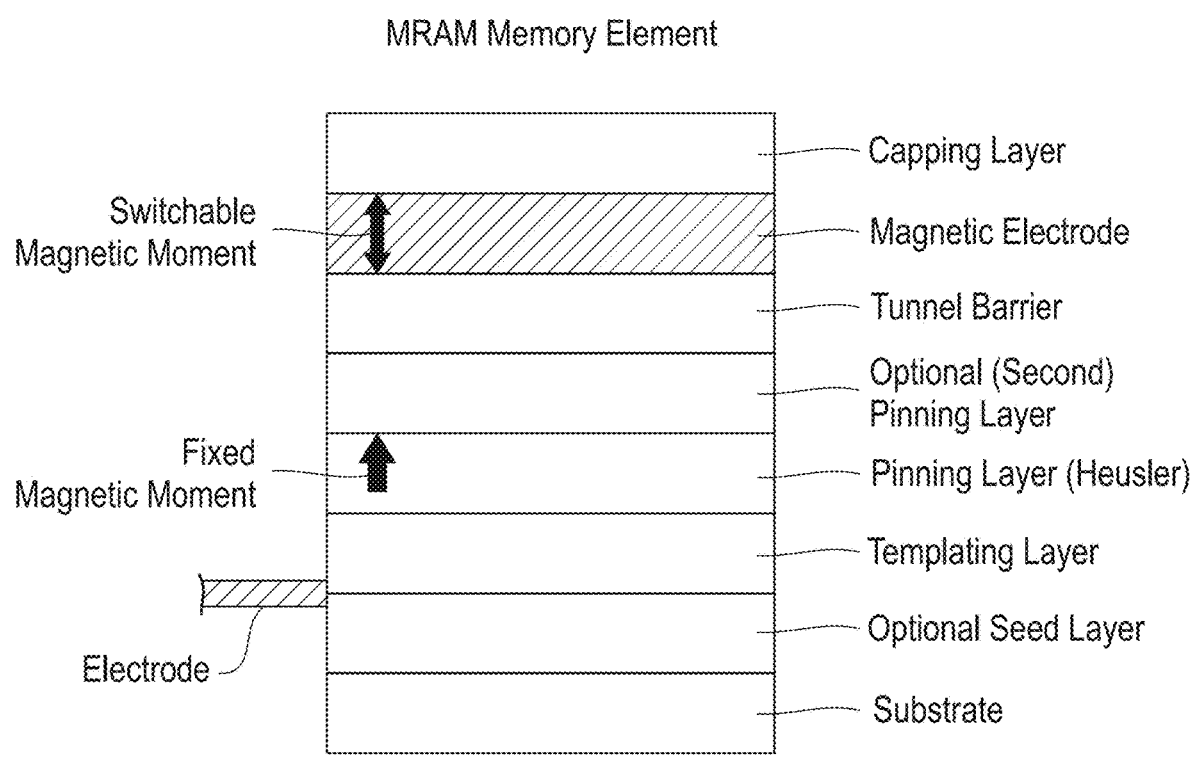
FIGS. 8A and 8B depict exemplary embodiments of MRAM elements.
Figure 8B:
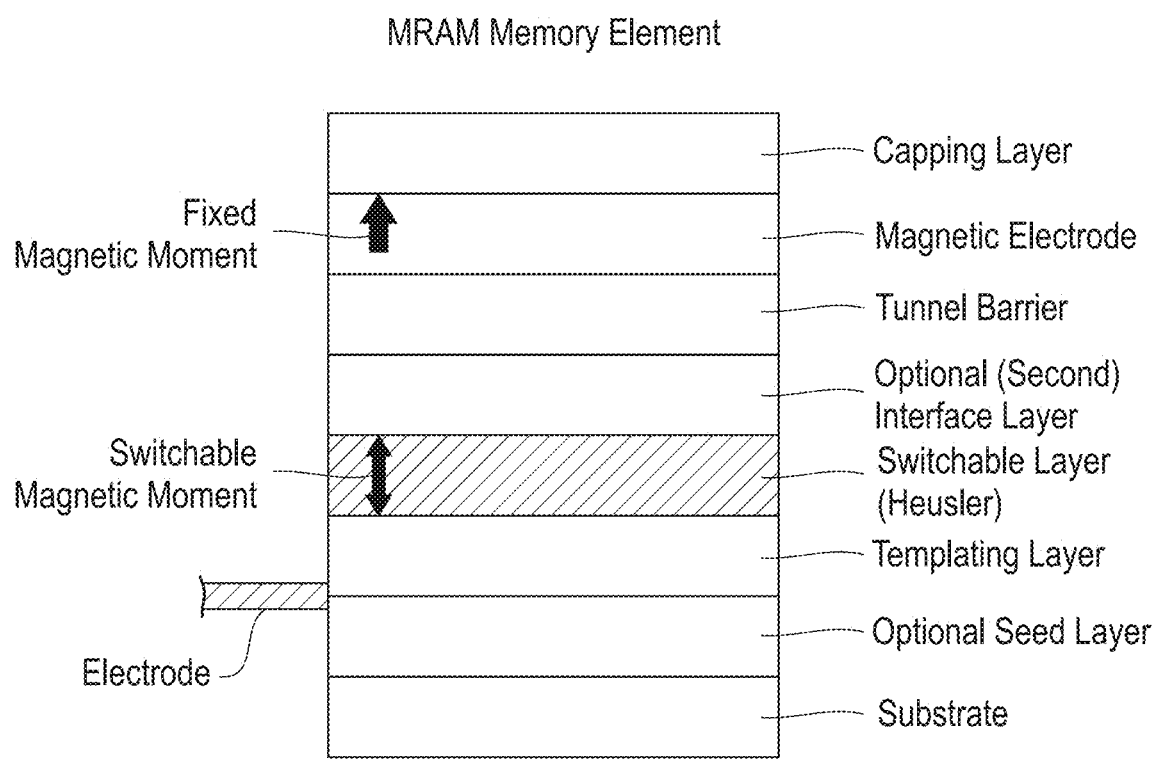

The structures described herein lend themselves to a variety of applications, including MRAM elements and a racetrack memory device. Examples of such MRAM elements are shown in FIGS. 8A and 8B. As with MRAM elements generally, a tunnel barrier is situated between two magnetic electrodes, one of which has a fixed magnetic moment and the other of which has a magnetic moment that is switchable, thereby permitting the recording and erasing of data. Unlike MRAM elements of the prior art, however, the magnetic layers of FIGS. 8A and 8B having either the fixed magnetic moment (pinning layer) or the switchable magnetic moment (storage layer) comprises Heusler films such as those described herein. An optional (second) interface layer may be advantageously employed for even better performance, as described herein.

Note that in FIG. 8A, the pinning layer (Heusler layer, which may be either ferro- or ferri-magnetic) overlies a seed layer which in turn overlies a substrate. As described herein, the respective compositions of the seed layer and the substrate may be advantageously chosen to promote growth of the Heusler layer, whose magnetic moment is aligned perpendicular to the layer plane. An optional, second interface layer may be used to increase performance, and may include Fe, a CoFe alloy, or $Co_2MnSi$. Note that in FIG. 8B, the switchable layer (Heusler layer, which may be either ferro- or ferri-magnetic) overlies a seed layer which in turn overlies a substrate. As described herein, the respective compositions of the seed layer and the substrate may be advantageously chosen to promote growth of the Heusler layer, whose magnetic moment is aligned perpendicular to the layer plane. An optional, second interface layer may be used to increase performance, and may include Fe, a CoFe alloy, or $Co_2MnSi$.

The tunnel barrier is preferably MgO (001), although other (001)-oriented tunnel barriers may be used, such as CaO and LiF. Alternatively, $MgAl_2O_4$ can be used as a tunnel barrier whose lattice spacing can be tuned by controlling Mg—Al composition which could result in better lattice matching with the Heusler compounds. The magnetic electrode overlying the tunnel barrier may comprise Fe, a CoFe alloy, or a CoFeB alloy, for example. FIG. 8B further illustrates that when the magnetic layer on top of the barrier has a fixed magnetic moment then its moment can be stabilized by placing a synthetic antiferromagnet (SAF) adjacent to it. The capping layer may comprise Mo, W, Ta, Ru, or a combination thereof. Current may be induced by applying a voltage between the two magnetic electrodes, which are separated by the tunnel barrier.

Certain structures described herein may also be used in racetrack memory devices. In this case, the racetrack is a nanowire that may include a substrate, an optional seed layer, a templating layer, and a first magnetic layer of a Heusler compound. (See the discussion above with respect to FIG. 8A for possible compositions of these layers. Note that in a racetrack memory device the tunnel barrier and the switchable magnetic layer shown in FIG. 8A would not normally be present; however, in this case the first magnetic layer shown in FIG. 8A would have a magnetic moment that is switchable rather than fixed.) Magnetic domain walls may be moved along this racetrack, as described in U.S. Pat. No. 6,834,005. Data may be read out of (and stored in) the racetrack by interrogating (or changing) the orientation of the magnetic moment of the magnetic material between adjacent domain walls within the racetrack.

The various layers described herein may be deposited through any one or more of a number of methods, including magnetron sputtering, electrodeposition, ion beam sputtering, atomic layer deposition, chemical vapor deposition, and thermal evaporation.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A device, comprising:
 a Heusler compound of the form $Mn_{3-x}Co_xGe$, wherein 0<x≤1, wherein Co accounts for at least 0.4 atomic percent of the Heusler compound and the Heusler compound has a tetragonal structure; and
 a substrate oriented in the direction (001) and of the form $YMn_{1+d}$, wherein Y includes an element selected from the group consisting of Ir and Pt, and 0≤d≤4,
 wherein the Heusler compound and the substrate are in proximity with each other, thereby allowing spin-polarized current to pass from one through the other.
2. The device of claim 1, wherein Y is Ir.
3. The device of claim 1, further comprising a tunnel barrier in contact with the Heusler compound.
4. The device of claim 3, wherein the tunnel barrier includes Mg and O.

5. The device of claim 1, further comprising a TaN layer between and in contact with the Heusler compound and the substrate.

6. The device of claim 1, wherein the Heusler compound is of the form $Mn_{3-x}Co_xGe$, wherein $0<x\leq 1$, and the substrate is of the form $IrMn_3$.

7. The device of claim 1, wherein the Heusler compound has a magnetic moment that is substantially perpendicular to the film plane.

8. The device of claim 7, wherein the Heusler compound has a thickness of at least 10 Angstroms and not more than 500 angstroms.

9. The device of claim 1, wherein a TaN layer is underneath and in contact with the substrate.

10. The device of claim 1, wherein the Heusler compound has a thickness of less than 5 nm.

11. The device of claim 1, wherein the Heusler compound has a thickness of less than 3 nm.

12. A device, comprising:
a Heusler compound of the form $Mn_{3-x}Co_xGe$, wherein $0<x\leq 1$, wherein Co accounts for at least 0.4 atomic percent of the Heusler compound, the Heusler compound having a tetragonal structure;
a multi-layered structure that is non-magnetic at room temperature, the multi-layered structure comprising alternating layers of Co and E, wherein E comprises at least one other element that includes Al, wherein the composition of the structure is represented by $Co_{1-y}E_y$, with y being in the range from 0.45 to 0.55; and
a substrate underlying the multi-layered structure;
wherein the Heusler compound and the multi-layered structure are in proximity with each other, thereby allowing spin-polarized current to pass from one through the other.

13. The device of claim 12, wherein the magnetic moment of the Heusler compound is substantially perpendicular to the interface between the multi-layered structure and the Heusler compound.

14. The device of claim 12, wherein the Heusler compound has a thickness of less than 5 nm.

15. The device of claim 12, wherein the Heusler compound has a thickness of less than 3 nm.

16. The device of claim 12, further comprising:
a tunnel barrier overlying the Heusler compound, thereby permitting current to pass through both the tunnel barrier and the Heusler compound.

17. The device of claim 16, wherein the tunnel barrier includes Mg and O.

18. The device of claim 16, further comprising a magnetic layer in contact with the tunnel barrier.

19. A device, comprising:
a Heusler compound of the form $Mn_{3-x}Co_xGe$, wherein $0<x\leq 1$, wherein Co accounts for at least 0.4 atomic percent of the Heusler compound, the Heusler compound having a tetragonal structure;
a multi-layered structure that is non-magnetic at room temperature, the multi-layered structure comprising alternating layers of Co and E, wherein E comprises at least one other element that includes Al, wherein the composition of the structure is represented by $Co_{1-y}E_y$, with y being in the range from 0.45 to 0.55; and
a substrate underlying the multi-layered structure;
wherein the Heusler compound and the multi-layered structure are in proximity with each other, thereby allowing spin-polarized current to pass from one through the other; and
wherein the Heusler compound has a thickness of one unit cell.

20. A device, comprising:
a Heusler compound of the form $Mn_{3-x}Co_xGe$, wherein $0<x\leq 1$, wherein Co accounts for at least 0.4 atomic percent of the Heusler compound, the Heusler compound having a tetragonal structure;
a multi-layered structure that is non-magnetic at room temperature, the multi-layered structure comprising alternating layers of Co and E, wherein E comprises at least one other element that includes Al, wherein the composition of the structure is represented by $Co_{1-y}E_y$, with y being in the range from 0.45 to 0.55; and
a substrate underlying the multi-layered structure;
wherein the Heusler compound and the multi-layered structure are in proximity with each other, thereby allowing spin-polarized current to pass from one through the other; and
wherein E is an AlGe alloy.

21. A device, comprising:
a Heusler compound of the form $Mn_{3-x}Co_xGe$, wherein $0<x\leq 1$, wherein Co accounts for at least 0.4 atomic percent of the Heusler compound, the Heusler compound having a tetragonal structure;
a multi-layered structure that is non-magnetic at room temperature, the multi-layered structure comprising alternating layers of Co and E, wherein E comprises at least one other element that includes Al, wherein the composition of the structure is represented by $Co_{1-y}E_y$, with y being in the range from 0.45 to 0.55; and
a substrate underlying the multi-layered structure;
wherein the Heusler compound and the multi-layered structure are in proximity with each other, thereby allowing spin-polarized current to pass from one through the other; and
wherein E is an AlGa alloy.

22. A device, comprising:
a Heusler compound of the form $Mn_{3-x}Co_xGe$, wherein $0<x\leq 1$, wherein Co accounts for at least 0.4 atomic percent of the Heusler compound, the Heusler compound having a tetragonal structure;
a multi-layered structure that is non-magnetic at room temperature, the multi-layered structure comprising alternating layers of Co and E, wherein E comprises at least one other element that includes Al, wherein the composition of the structure is represented by $Co_{1-y}E_y$, with y being in the range from 0.45 to 0.55; and
a substrate underlying the multi-layered structure;
wherein the Heusler compound and the multi-layered structure are in proximity with each other, thereby allowing spin-polarized current to pass from one through the other; and
wherein E includes an alloy selected from the group consisting of AlSn, AlGe, AlGaGe, AlGaSn, AlGeSn, and AlGaGeSn.

23. A method, comprising:
using a device as a memory element, the device including
a Heusler compound of the form $Mn_{3-x}Co_xGe$, wherein $0<x\leq 1$, wherein Co accounts for at least 0.4 atomic percent of the Heusler compound, the Heusler compound having a tetragonal structure; and
a substrate oriented in the direction (001) and of the form $YMn_{1+d}$, wherein Y includes an element selected from the group consisting of Ir and Pt, and $0<d\leq 4$;

wherein the Heusler compound and the substrate are in proximity with each other, thereby allowing spin-polarized current to pass from one through the other and wherein a TaN layer is underneath and in contact with the substrate.

24. A method comprising:

using a device as a memory element, the device including a first magnetic layer that includes a Heusler compound of the form $Mn_{3-x}Co_xGe$, wherein $0<x\leq 1$, wherein Co accounts for at least 0.4 atomic percent of the tetragonal Heusler compound, the Heusler compound having a tetragonal structure; and a multi-layered structure that is non-magnetic at room temperature, the structure comprising alternating layers of Co and E, wherein E comprises at least one other element that includes Al, wherein the composition of the structure is represented by $Co_{1-y}E_y$, with y being in the range from 0.45 to 0.55; and a tunnel barrier;

a second magnetic layer; wherein the first magnetic layer, the multi-layered structure, the tunnel barrier, and the second magnetic layer are in proximity with each other, thereby allowing spin-polarized current to pass from one through the other;

wherein the tunnel barrier includes MgO.

25. A device, comprising:

a substrate;

a underlayer oriented in the direction (001) that is non-magnetic at room temperature, the underlayer overlying the substrate;

a first magnetic layer that includes a Heusler compound $Mn_{3-x}Co_xGe$, wherein $0<x\leq 1$, the first magnetic layer being in contact with the underlayer, wherein the magnetic moment of the first layer is switchable;

a tunnel barrier overlying the first magnetic layer; and a second magnetic layer in contact with the tunnel barrier.

26. The device of claim 25, further comprising a capping layer in contact with the second magnetic layer.

27. The device of claim 25, wherein the magnetic moment of the first magnetic layer is substantially perpendicular to the interface between the tunnel barrier and the first magnetic layer.

* * * * *